United States Patent [19]
Fuller et al.

[11] Patent Number: 6,130,172
[45] Date of Patent: Oct. 10, 2000

[54] RADIATION HARDENED DIELECTRIC FOR EEPROM

[75] Inventors: Robert T. Fuller, Melbourne Beach; Howard L. Evans, Palm Bay; Michael J. Morrison, Malabar; David A. DeCrosta, Melbourne; Robert K. Lowry, Melbourne Beach, all of Fla.

[73] Assignee: Intersil Corporation, Palm Bay, Fla.

[21] Appl. No.: 09/061,602

[22] Filed: Apr. 16, 1998

Related U.S. Application Data

[62] Division of application No. 08/666,258, Jun. 20, 1996.

[51] Int. Cl.⁷ ................................................. H01L 21/31
[52] U.S. Cl. .................. 438/783; 438/953; 438/778; 438/784; 438/785; 438/257; 438/261; 438/286; 438/299; 438/301; 438/302; 257/651
[58] Field of Search ..................... 438/257, 261, 438/286, 299, 301, 302, 783, 778, 785, 953; 257/651

[56] References Cited

U.S. PATENT DOCUMENTS

| | | |
|---|---|---|
| 3,881,180 | 4/1975 | Gosney, Jr. . |
| 4,546,016 | 10/1985 | Kern ........................................ 427/255 |
| 4,782,037 | 11/1988 | Tomozawa et al. . |
| 5,159,431 | 10/1992 | Yoshikawa . |
| 5,235,202 | 8/1993 | Yee et al. . |
| 5,241,208 | 8/1993 | Taguchi . |
| 5,329,486 | 7/1994 | Lage . |
| 5,409,743 | 4/1995 | Bouffard et al. ........................ 427/579 |
| 5,648,300 | 7/1997 | Nakayama et al. ..................... 437/228 |

OTHER PUBLICATIONS

S. Rojas et al. J. Vac. Sci. Tech. B. 10(2), p. 633, Mar. 1992.

*Primary Examiner*—John F. Niebling
*Assistant Examiner*—Viktor Simkovic
*Attorney, Agent, or Firm*—Jaeckle Fleischmann & Mugel, LLP

[57] ABSTRACT

A EEPROM 140 has a storage transistor 160 with a gate insulating layer 104 of BPSG and a polysilicon gate 112.2 of the same layer as the polysilicon gate 112.1 of the FET transistor 150. The BPSG layer 104 has POHC traps that capture holes injected into N well 103.2. A positive voltage applied to N well 103.2 programs the storage transistor 160 off. Applying a positive voltage to the gate 112.2 neutralizes the holes stored in layer 104 and erases the memory of transistor 160.

12 Claims, 7 Drawing Sheets

| | $WL_0$ | $EL_{00}$ | $PL_{00}$ | $BL_{00}$ | $BL_{07}$ | $EL_{10}$ | $PL_{10}$ | $BL_{10}$ | $WL_1$ | $EL_{01}$ | $PL_{01}$ | $EL_{11}$ | $PL_{11}$ |
|---|---|---|---|---|---|---|---|---|---|---|---|---|---|
| PROG. | 12 | 5 | 12 | 10or0 | 10or0 | 0 | 0 | 0 | 0 | 0 | 0 | 0 | 0 |
| ERASE | 12 | 12 | 0 | 0 | 0 | 0 | 0 | 0 | 0 | 0 | 0 | 0 | 0 |
| READ | 5 | 0 | ~3.5 | 5 | 5 | 0 | 0 | 0 | 0 | 0 | 0 | 0 | 0 |

FIG. 19B
PRIOR ART

RADIATION HARDENED DIELECTRIC FOR EEPROM

This is a divisional of Ser. No. 08/666,258 filed Jun. 20, 1996.

BACKGROUND

Borophosphosilicate Glass (BPSG) is often used as a radiation hardened interlevel dielectric. In the past, BPSG layers were deposited using typical atmospheric chemical vapor deposition techniques. BPSG layers can also be deposited by plasma enhanced chemical vapor (PECVD) deposition techniques. However, we found that PECVD BPSG layers were radiation soft, rather than radiation hard. That finding lead us to conduct a series of experiments to determine the causes of radiation hardness or softness in BPSG layers. In particular, it suggested that the radiation hardness of a BPSG layer may depend upon the method of its deposition rather than its stoichiometry.

Electrically erasable programmable read only memories (EEPROMs) are devices that can retain a charge on a transistor when the voltage supply to the transistor is removed. EEPROMS are well known devices. A typical EEPROM includes an array of standard FET transistor and an array of storage transistors. One problem with existing EEPROMs is that substantially different steps are required to form the two kinds of transistors. One kind of EEPROM relies upon a gate insulating material comprising a layer of silicon dioxide and silicon nitride. The interface between the nitride layer and the oxide layer can trap injected charges and thereby provide a memory device. An example of one such EEPROM is shown in U.S. Pat. No. 3,881,180. One disadvantage of such a structure in the dual layer gate insulating layer. Those layers are applied in separate steps and thus increase the overall complexity and expense of the EEPROM. Another type of EEPROM is a floating gate, avalanche-injection MOS transistor or FAMOS. The conductive gate is electrically isolated by enclosing the gate in silicon dioxide. The process for forming such a floating gate usually requires separate steps for depositing a first oxide layer on the surface of the substrate and a second oxide layer on the surface and the sides of the conductive gate material. Such a device is described in Device Electronics for Integrated Circuits, R. S. Muller and T. I. Kamins, John Wiley & Sons, (1977), pp 372, 373.

SUMMARY

The invention provides a method for controlling the radiation hardness of a layer of BPSG. The method includes generating a plasma to deposit a BPSG layer and adjusting selected ratios of the gases used to deposit BPSG. We found that the radiation hardness can be increased by: (1) increasing the ratio of nitrous oxide to silane, (2) increasing the ratio of phosphorous precursor to silane, or (3) decreasing the ratio of phosphorous precursor to nitrous oxide. As such, the BPSG layer can be adjusted through the method of fabrication to have different numbers of phosphorous-oxygen hole centers (POHCs). The hole centers trap injected holes until the POHCs are saturated. We further discovered that the trapping process is reversible. So, when electrons are injected into a layer saturated with trapped holes, the electrons neutralize the traps. The layer can then trap holes again.

We have further found that EEPROMs can be made using radiation hard layers of BPSG as the insulating layers for the gates of the EEPROM storage transistor. The overall fabrication of the EEPROM is simpler since the polysilicon layer used for the gates of the regular field effect transistors (FETs) can also be used to form the gates of the storage transistors. The BPSG layer with its increased POHCs traps holes injected into the BPSG layer from the storage transistor N well. The memory of the storage transistor is erased by applying a high positive voltage to the gate of the storage transistor.

BRIEF DESCRIPTION OF THE DRAWINGS

FIG. 19b is a chart showing the programming, erase and read voltages for the cell of FIG. 19a.

DETAILED DESCRIPTION

I. Introduction

Although Borophosphosilicate Glass (BPSG) is commonly used in the manufacture of semiconductor devices, there are very few published studies on the trapping characteristics of the bulk material (1,2) or thin BPSG films (3,4). The published studies do not investigate the dependence of trapping characteristics on the film deposition parameters. We investigated the trapping characteristics BPSG films deposited by two popular techniques. Additionally we attempted to relate the trapping characteristic to specific trapping centers and the presence of these trapping centers to the film stoichiometry.

II. Experiment

BPSG films from two common deposition tools were studied. Films labeled A were deposited in an atmospheric pressure chemical vapor deposition (APCVD) system using silane, phosphine, and diborane in an overpressure of oxygen. Films labeled B1 were deposited in a plasma enhanced chemical vapor deposition (PECVD) system using silane, phosphine, and dihydrodiborane in an overpressure of nitrous oxide and a nitrogen carrier gas. Films labeled B2 were deposited in the PECVD system using a lower silane to nitrous oxide ratio and lower chamber pressure from films B1. The phosphine and dihydrodiborane flow were chosen to result in the same weight percentage of boron and phosphorus in each film type. Half micron thick samples were created of each film on blank-high resistivity silicon wafers for the ESR, FTIR and CV measurements. These films were densified to represent silicon wafers for the ESR, FTIR and CV measurements. These films were densified to represent the films as found in the semiconductor devices. CMOS transistors were also created using film types A and B1 as the dielectric layer between the polysilicon gate and the first layer of metal. The CMOS process used is a radiation hardened 1.2 micron process that has been in production for about eight years. These samples were used for the gamma cell testing.

III. Results

A. Gamma Cell Testing

Test transistors from the CMOS wafers were packaged and tested using a $Co^{60}$ gamma ray source. The devices were maintained at room temperature during radiation and were biased under worst case conditions. The dose rate in the gamma cell was approximately 1.2 Krad (Si) per minute. The device parameters were measured using an HP 4062B test system before and after various radiation levels. The results from the metal over thick field oxide n-channel FETs are given in Table I for each film type. Devices with film B1 as the gate dielectric have several orders of magnitude more off-state leakage than the devices with film A as the gate dielectric.

TABLE 1

Gamma Cell Test Results

| Radiation Level | Film A N-field FET $I_{art}$ | Film B1 N-Field FET $I_{art}$ |
|---|---|---|
| Pre-Rad | $1 \times 10^{-12}$ A | $1 \times 10^{-12}$ A |
| 50 KRad (Si) | $1 \times 10^{-12}$ A | $1 \times 10^{-12}$ A |
| 150 KRad (Si) | $3 \times 10^{-12}$ A | $8 \times 10^{-10}$ A |
| 300 KRad (Si) | $3 \times 10^{-12}$ A | $1 \times 10^{-7}$ A |

B. CV Measurement

Figure 1:
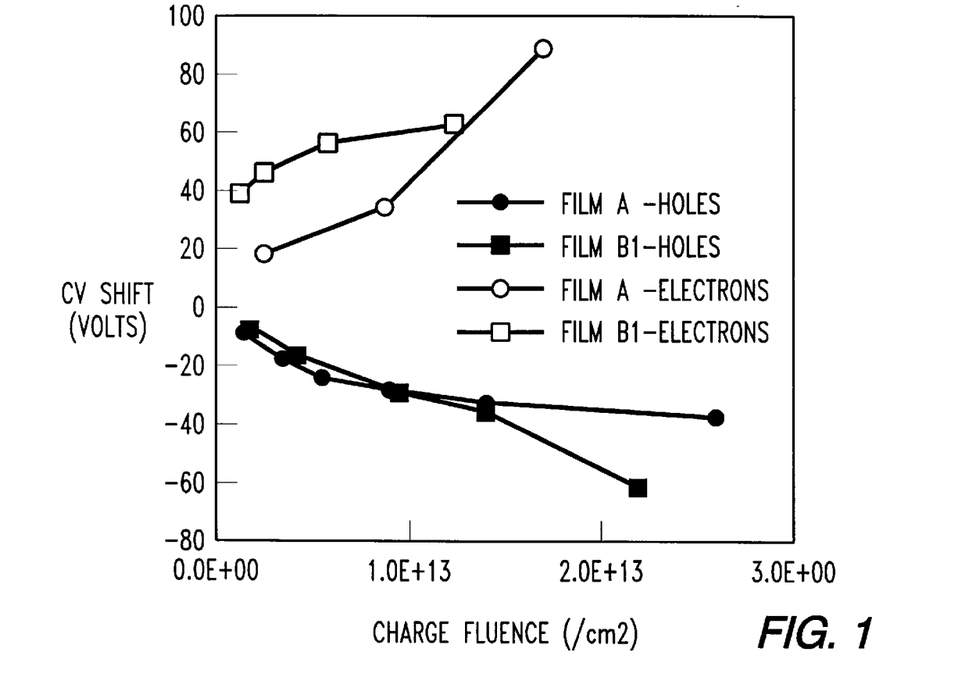
FIG. 1 shows voltage shifts due to injected charge for films A and B1.

Charge was injected into the thin film samples of films A and B1 by first charging the oxide surface using corona ions and subsequently exposing the samples to 10.2 eV vacuum ultraviolet (VUV) photons to inject holes or 5 eV ultraviolet (UV) photons to inject electrons (5). The CV shifts were determined using a mercury probe. The results are shown in FIG. 1. Both films have a high density of electron and hole traps with large capture cross sections of approximately $1 \times 10^{-13}/cm^2$ while the shift for film B1 continues to increase. This contrasts with electron injection where the CV shift for film B1 saturates and the shift for film A continues to increase. Apparently the quality of the oxide for radiation hardness depends on obtaining a balance between electron and hole trapping as opposed to simply minimizing the overall trap density. This balance can be changed dramatically depending on the deposition method.

C. ESR Measurement

Figure 2:
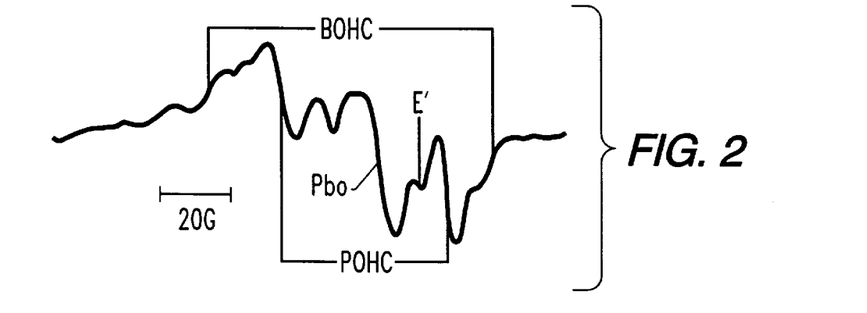
FIG. 2 shows ESR spectra from film A after two hours VUV exposure.
Figure 3:
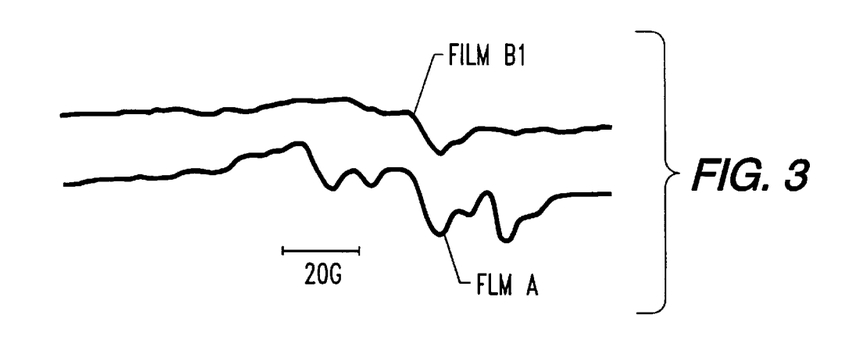
FIG. 3 is a comparison of ESR spectra for samples A and B1 after two hours VUV exposure.
Figure 4:
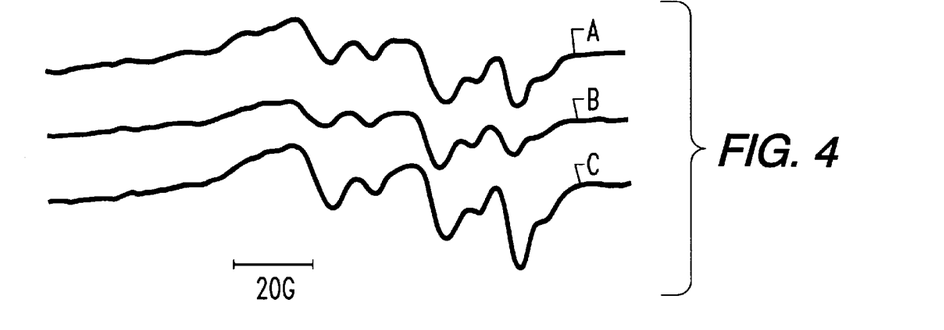
FIG. 4 shows ESR spectra of film A after (a) two hours VUV, (b) injection of $4 \times 10^{13}/cm^2$ electrons, and (c) injection of $3 \times 10^{13}/cm^2$ holes.
Figure 5:
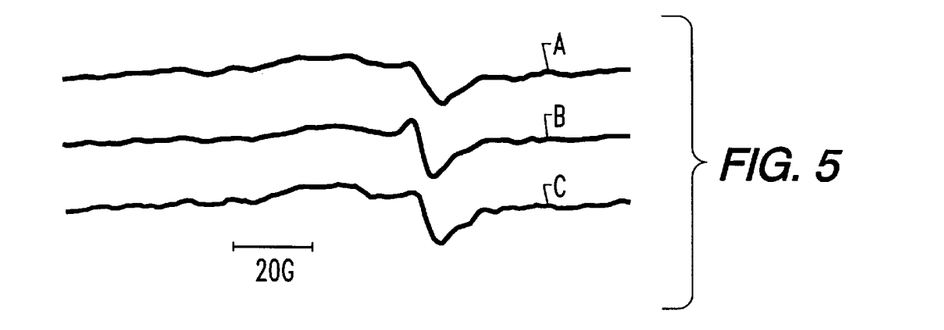
FIG. 5 shows ESR spectra of film B1 after (a) two hours VUV, (b) injection of $4 \times 10^{13}/cm^2$ electrons, and (c) injection of $3 \times 10^{13}/cm^2$ holes.
Figure 6:
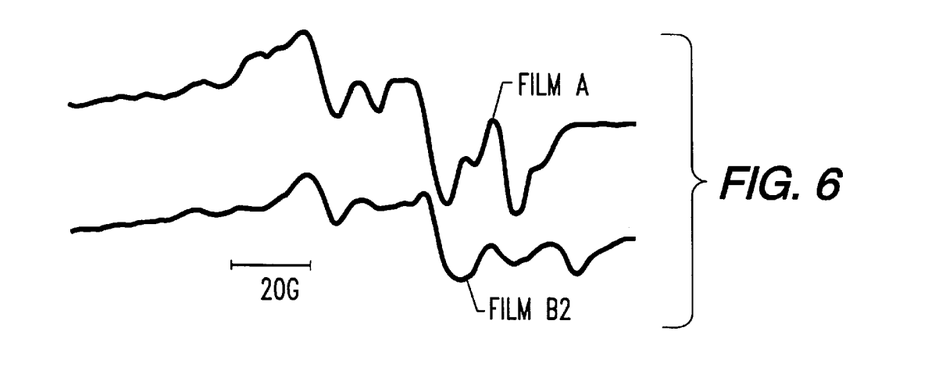
FIG. 6 shows ESR spectra of film A and B2 after two hours VUV.

To further investigate the nature of the traps in these films, ESR measurements were performed. The traps were activated by combinations of VUV flooding, hole injection, and electron injection as described above. The resulting ESR spectra from film A after two hours exposure to VUV photons is shown in FIG. 2. E', $P_{bo}$, POHC and BOHC centers are discernible in the spectra as seen in earlier studies. (1–4). The concentration of these various defects as derived from the ESR spectra is about $1 \times 10^{+17}/cm^3$ electrons, injection of $2 \times 10^{+13}/cm^2$ holes. The injection of electrons decreases the POHN spin density by more than a factor of two the BOHC signal remains unchanged. The injection of holes increases the POHC spin density by more than a factor of two. Again the BOHC signal remains unchanged. These measurements indicate that in film A the POHC centers become paramagnetic when holes are trapped and diamagnetic when electrons are trapped as observed by Warren et al (4). FIG. 5 shows the ESR spectra for film B1 after the same treatments as film A. The only change in the spectra is an increase in the $P_{bo}$ center signal with electron injection and a subsequent decrease with hole injection. It is clear from these measurements that the two films behave quite differently. A second film sample from tool B was evaluated to determine if a change to the deposition conditions in the same tool would affect the trap characteristics of the film. The ESR spectra of film B2 is shown in comparison to film A after two hours of VUV exposure in FIG. 6. BOHC and POHC centers are evident in film B2, but at a much lower level than in sample B1. This indicates that the deposition process recipe affects the trapping characteristics.

D. FTIR Measurements

Figure 7:
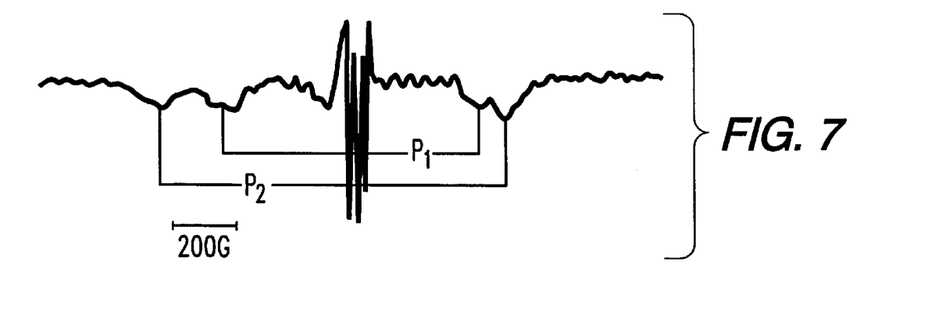
FIG. 7 shows reflectance FTIR spectra from films A, B1 and B2.

To examine the structural units and bond variations of the three films; FTIR measurements were made. The results are shown in FIG. 7. The most significant difference in the FTIR spectra is the oxygen-hydrogen (as OH, hydroxl) bonding. Film B1 has the greatest degree of oxygen-hydrogen bonding followed by film B2 and then film A.

IV. Discussion

A. Charge Trapping in Film A

The difference in the radiation tolerance between films A and B1 can be explained by the trapping characteristics of the films. From the CV shift information, it is clear that Film B1 traps holes more efficiently than film A, while film A traps electrons more efficiently than film B1. This means that for a given hole fluence, film A traps fewer holes than film B1 and the holes that are trapped in film A are more likely to be compensated by the trapping of an electron. The ESR measurements indicate that the holes are trapped in POHC and $P_1$ centers in Film A. The POHC signal can be extinguished by the injection of electrons. This supports the POHC model suggested by Warren et al. (4). In this model, the POHC precursor is a neutral single nonbinding oxygen that becomes positively charged after the capture of a hole. This center could then act as a columbic trap for electrons. Griscom et al (2) proposed the $P_1$ center to be a trapped hole at a $P_2O_3$ nonstoichiometric configuration and the $P_2$ to be an electron trapped at a $PO_2$ nonstoichiometric configuration. The presence of $P_2$ centers in film A could explain why film A traps electrons more efficiently than file B1.

B. Charge Trapping in Film B1 and B2

Figure 8:
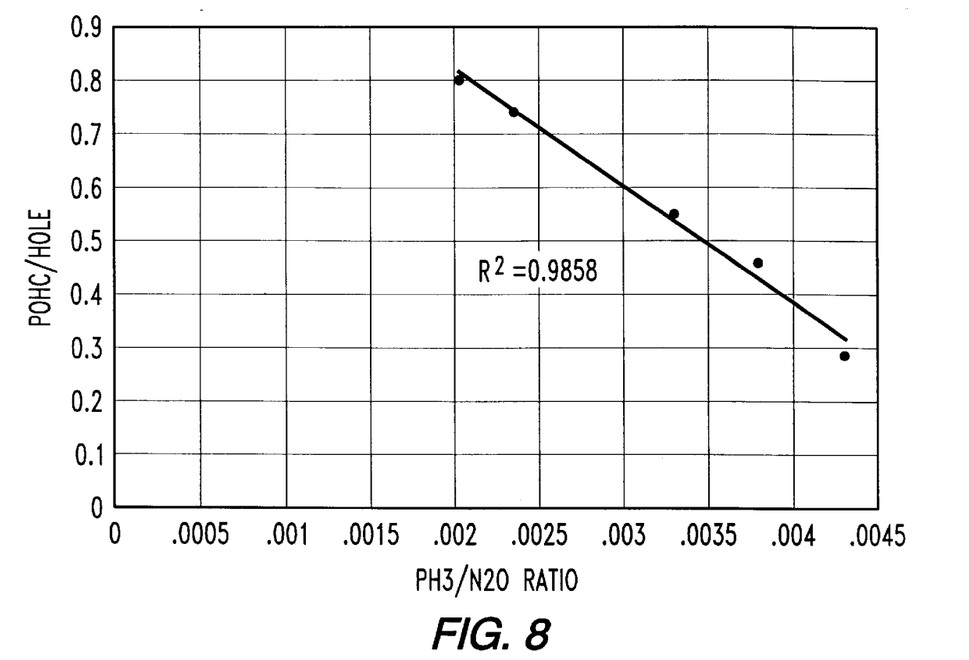
FIG. 8 is a graph showing the normalized POHC concentration as a function of the ratio of phosphine to nitrous oxide.

Film B1 traps holes very efficiently. After hole injection, it then will trap electrons. No ESR signals other than a small $P_{bo}$ center were detected in film B1 after hole trapping or subsequent electron trapping. This supports the suggestion by Warren et al. (4) that both the precursor and the positively charged sites are diamagnetic. Film B2, however, behaves more like film A, but with a lower magnitude of POHC centers. This observation along with the FTIR measurements suggests that the improvement in films A and B2 over B1 may be due to the reduced oxygen-hydrogen bonding in film B2. Clearly the radiation tolerance of this film can depend greatly on the deposition conditions. In FIG. 8, there is shown the affect of varying the ratio of phosphine ($PH_3$)

to nitrous oxide ($N_2D$). As the ratio increases, the density of POHC/injected holes increase. Higher densities increase the radiation hardness of the BPSG film.

V. Conditions

BPSG films deposited by APCVD and PECVD were evaluated using gamma cell testing, electron spin resonance (ESR), Fourier Transfer Infrared spectroscopy (FTIR), and capacitance voltage (CV) measurements. The results indicate that two stoichiometrically similar films can differ greatly in radiation tolerance depending on the deposition conditions. The difference in the radiation tolerance can be explained by the film's trapping characteristics. The radiation hard APCVD film displayed previously reported trapping centers in the ESR signal. The radiation soft PECVD film showed no discernible trapping centers in the ESR signal. FTIR measurements show that the soft film had a significantly higher level of oxygen-hydrogen bonding than the hard film. A PECVD film with a lower silane to nitrous oxide ratio during the deposition displays ESR characteristics similar to the APCVD film, confirming that deposition conditions are critical in creating a radiation hardened film.

VI. EEPROM Fabrication

The foregoing experimental results indicate that radiation hard PECVD or APCVD films of BPSG can be deposited to form insulating layers that trap holes. This characteristic of trapping holes renders the BPSG films suitable for fabricating storage transistors, particularly storage transistors in EEPROMS. Our experiments indicated that trapped holes are neutralized by injecting electrons into the BPSG layer. So, the traps are reversible. This lead us to conclude that a radiation hard BPSG layer may be suitable as storage media for EEPROM devices. We further discovered that EEPROMS using BPSG films can be deposited with a single layer of polysilicon forming the conductive gate material for both the standard field effect transistors as well as the storage transistors. This represents a significant technical advantage compared to prior art devices. Prior art devices require two separate layers of polysilicon for the conductive gate of the standard FET transistor and the storage transistor. In prior art devices, the gate of the storage transistor requires additional, extra doping and also is of a different size. In contrast, the gates of the storage transistors using a BPSG layer of the invention are the same size as the gates of the standard FET transistor. The following description discloses fabrication of a PMOS FETs, and PMOS storage transistor. Those skilled in the art will appreciate that the EEPROM includes multiple FETs and multiple storage transistors that are suitably interconnected to form functional EEPROM devices. Those skilled in the art also know the process described below can be adapted to for NMOS transistor or CMOS transistors.

Figure 9:
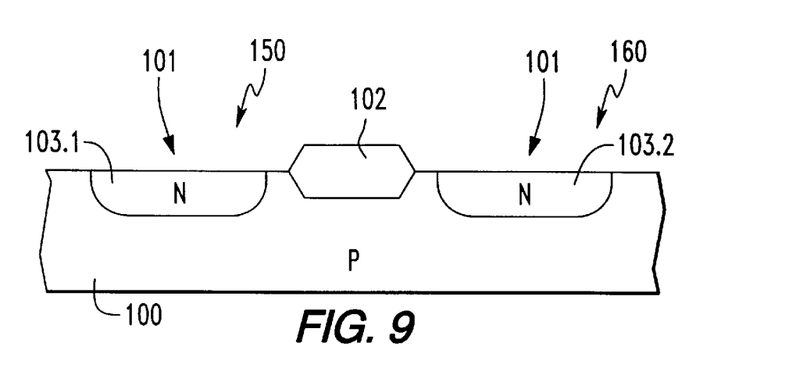
FIGS. 9–16 show sequential steps in the formation of a standard field effect transistor and a storage transistor in a EEPROM.

With reference to the Figures, and more particularly to FIG. 9, the EEPROM device is formed in a substrate monocrystalline silicon 100 which is lightly p-doped with boron in a concentration of about $10^{15}$ atoms/cm$^2$. The silicon substrate 100 has a crystal orientation of 100. The substrate is initially masked with oxide of a thickness of about 0.5 microns. Phosphorous is implanted into the surface of the substrate to establish lightly doped and N wells 103.1, 103.2. The phosphorous dose is approximately $4\times10^{12}$ atoms/cm$^2$ and is implanted at an energy of 18 keV. The implant is then diffused into substrate 100 for 300 minutes at a temperature of 1150° C. Thereafter, the oxide mask is removed and a field oxide 102 is grown. A layer of nitride covers the device regions 150, 160. In regions not covered by nitride, a relatively thick field oxide 102 is grown. The field oxide 102 is grown by a typical thermal oxidation method. The silicon substrate 100 is oxidized in steam and HCl at a temperature of approximately 1000° for about 75 minutes. After completion, the nitride mask is removed to provide the structure shown in FIG. 9. Next boron 101 is implanted into the device areas 150, 160 in order to provide a threshold adjustment in the N-well. Boron is implanted at a dose of $2.0\times10^{11}$ atoms/cm$^2$ at 10 keV. Then a PECVD BPSG layer 104 (FIG. 10) is uniformly deposited over the surface of the substrate 100. The BPSG 104 layer is approximately 0.025 microns thick. Layer 104 is formed in a PECVD machine made by novellus using a plasma and BPSG precursor gases.

Figure 10:
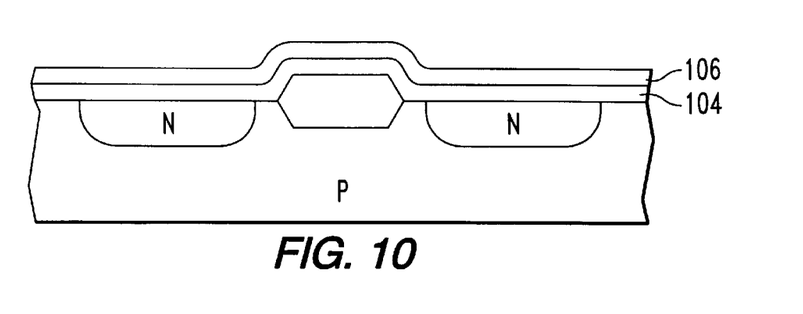

The temperature of the process is set to about 400° C. at the pressure of 2600 mTorr. Suitable gases are introduced at controlled rates including $N_2O$ at 5 standard liters per minute (slpm), silane ($SiH_4$) at 200 standard cubic centimeters per minute (sccm), phosphine ($PH_3$) at 430 sccm, diboraine ($B_2H_6$) at 610 sccm and nitrogen ($N_2$) at 910 sccm. The plasma is operated at about one (1) kilowatt at high frequency, around 13 mhz.

Figure 11:
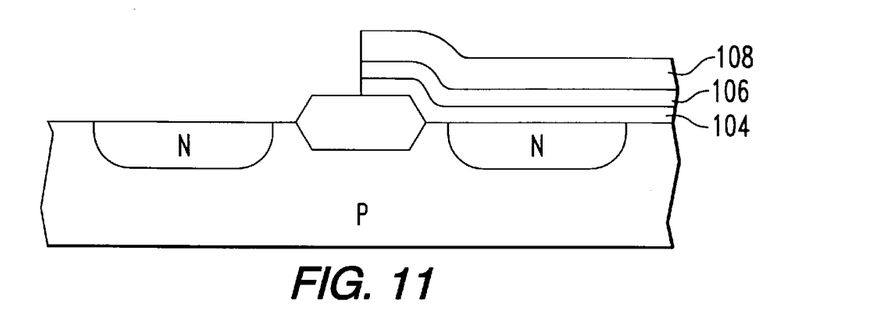
Figure 12:
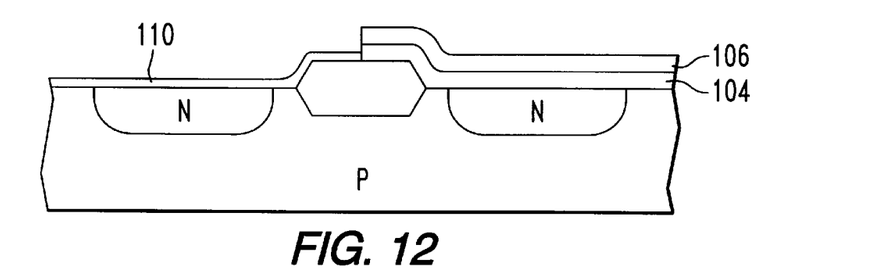

A protective nitride layer 106 is deposited over BPSG layer 104. Nitride layer 106 is approximately 0.04 microns thick. A photoresist layer 108 (FIG. 11) is deposited over the nitride layer 106 and patterned to expose the nitride layer over the region of the standard FET transistor 150. That masking operation is shown in FIG. 11. The exposed nitride and BPSG layers 106, 104 are removed from over the region 150 in order to expose the surface of the silicon substrate 100. A gate oxide layer 110 (FIG. 12) is grown over the region 150. The gate oxide layer is typically grown by a thermal oxidation method at a temperature of approximately 900° in a steam and HCl atmosphere at atmospheric pressure. The time for depositing the gate oxide layer is approximately 60 minutes.

Figure 13:
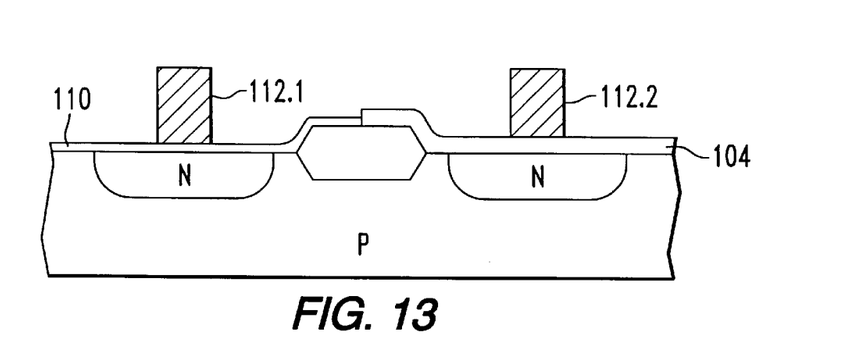

Thereafter, the remaining protective nitride layer 106 is removed from the surface of substrate 100. A uniform layer of polysilicon 112 is deposited over the substrate 100. The layer 112 is patterned to form gate structures 112.1, 112.2 (FIG. 13) over the respective standard FET area 150 and the storage transistor area 160. The polysilicon layer 112 is approximately 0.25 microns thick and includes polysilicon doped with phosphorous with a doping of approximately $1\times10^{15}$ atoms/cm$^3$.

Figure 14:
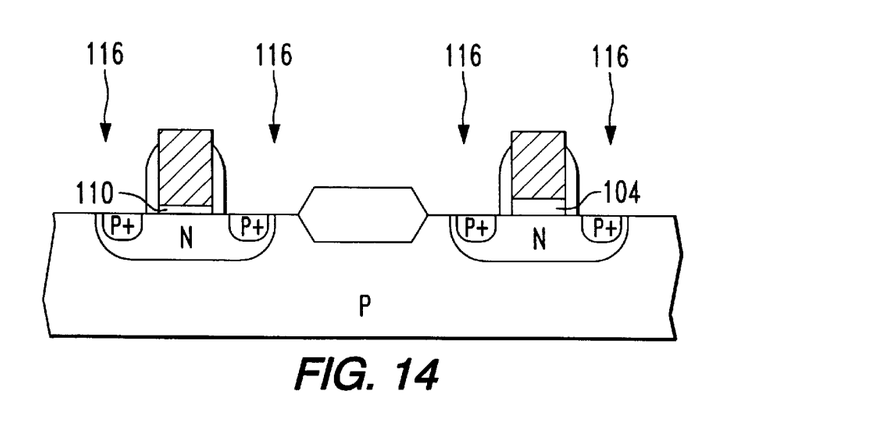
Figure 15:
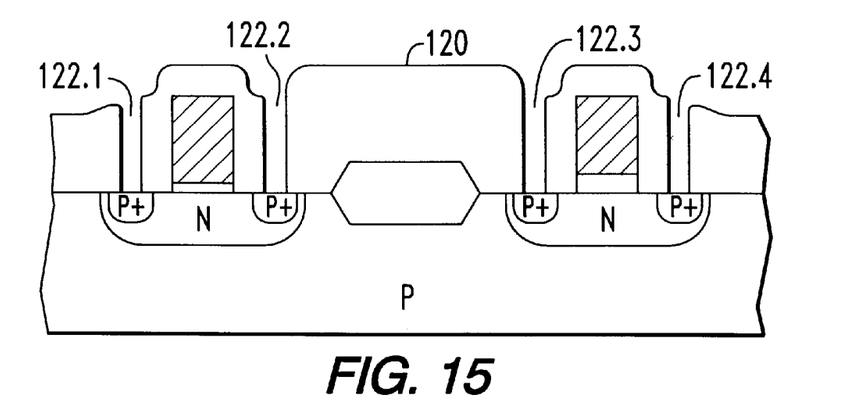
Figure 16:
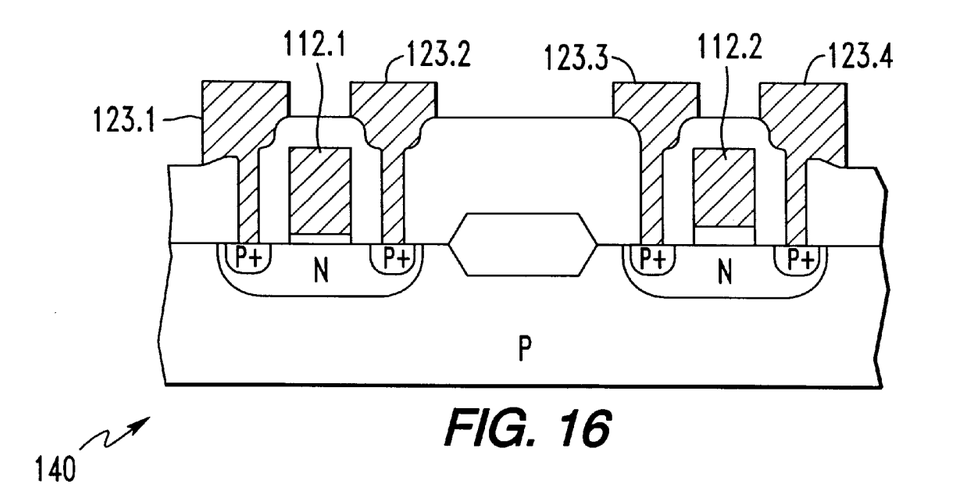
Figure 17:
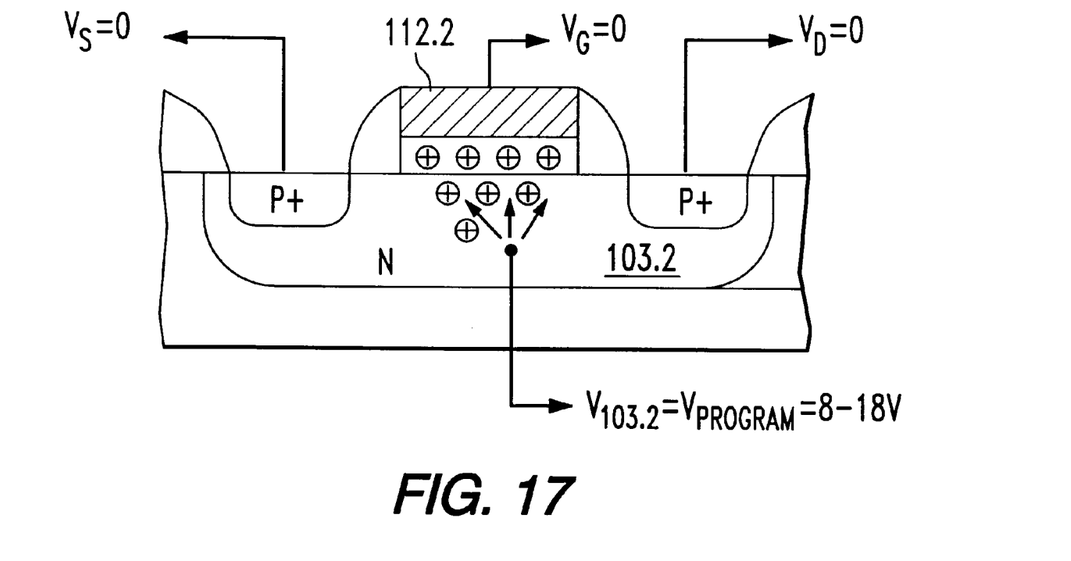
FIG. 17 illustrates a cross-section of an unprogrammed EEPROM.

Next a thick layer of deposited oxide 114 is uniformly deposited over the substrate 100 and subsequently patterned to form side wall spacers 114.1–114.4 (FIG. 14) on opposite sides of the polysilicon gate structures 112.1 and 112.2. The thick oxide layer 114 is removed from above the source and drain regions of the transistors in order to expose the transistors to a P+ boron implant 116 of about $8\times10^{14}$ atoms/cm$^2$ with an implant energy of approximately 10 keV. The latter boron implant forms the P+ regions that are the sources and drains of the respective standard FET transistor 150 and the storage transistor 160. An interlevel dielectric layer 120 (FIG. 15) is uniformly deposited over the substrate 100. Vias 122.1–122.4 are opened in the interlevel dielectric layer 120. A contact metal layer 123 is uniformly deposited over the substrate and is then subsequently patterned to form contacts 123.1–123.4 (FIG. 16) to the respective drains and sources to form EEPROM 140 with standard transistor 150 and storage transistor 160.

As a result of the above process, the storage transistor has a doped storage oxide layer 104 of BPSG between its gate 112.2 and the surface of the substrate 100. The BPSG layer 104 has a relatively large number of POHC traps. Accordingly, the storage transistor 106 may be suitably programmed to place a charge on the gate 112.2 and relatively permanently set the storage transistor 160 in a predetermined on or off state.

In the storage transistor 160 the BPSG layer 104 has a controlled number of POHC charge traps. The density of the charge traps is controlled by the PECVD process that deposits BPSG layer 104. The POHC traps have the property that they are electrically neutral when they are empty. However, they can easily trap holes and become positively charged. After trapping a hole, they can be neutralized by injecting electrons into the BPSG layer 104.

The channel length of the storage transistor 160 can be any suitable length that gives appropriate performance and may also have any appropriate junction depths and doping characteristics. More particularly, the junction depths and doping characteristics are compatible with standard FET transistors 150. In a typical storage transistor the channel length may be between 0.8–1.5 microns, the thickness of the BPSG layer 104 may be between 100 and 300 nm, the source/drain junction depth is 0.2–0.4 microns, the source/drain concentration is $1 \times 10^{20}$ atoms/cm$^3$, and the N-well concentration is between $5 \times 10^{17}$ and $5 \times 10^{18}$ atoms/cm.

The storage device 106 is programmed by avalanche injection of holes. Avalanche injection is accomplished by biasing the transistor 160 such that the N well 103.2 is coupled to a source of positive potential of between 8–18 volts. The drain, the gate and the source are grounded. With such programming, hot holes are injected from the positive potential connected to the N well 103.2 into the POHC traps in the layer 104. Those skilled in the art will appreciate that the programming potential of the positive voltage connected to the N well 103.2 depends upon the thickness of the BPSG layer 104.

The storage device is erased using Fowler-Nordheim injection of electrons. In order to erase a program storage transistor, the gate 112.2 is connected to a positive source of voltage and the N well 103.2 is grounded. Again, the magnitude of the positive source of voltage connected to the gate 112.2 depends upon the thickness of the BPSG layer 104. In the preferred embodiment, the voltage is between 8–18 volts. By applying a positive voltage to the polysilicon gate, 112.2, electrons are attracted from the N well 103.2 into the BPSG layer 104 where the electrons thus neutralize the holes that were previously trapped in layer 104.

Figure 18:
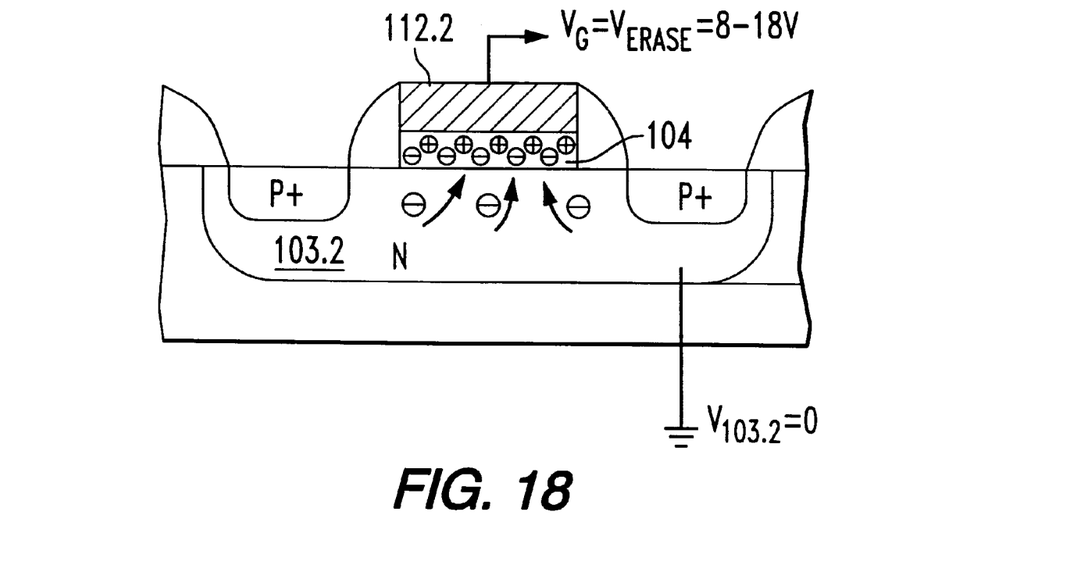
FIG. 18 illustrates a cross-section of a programmed EEPROM.
Figure 19A:
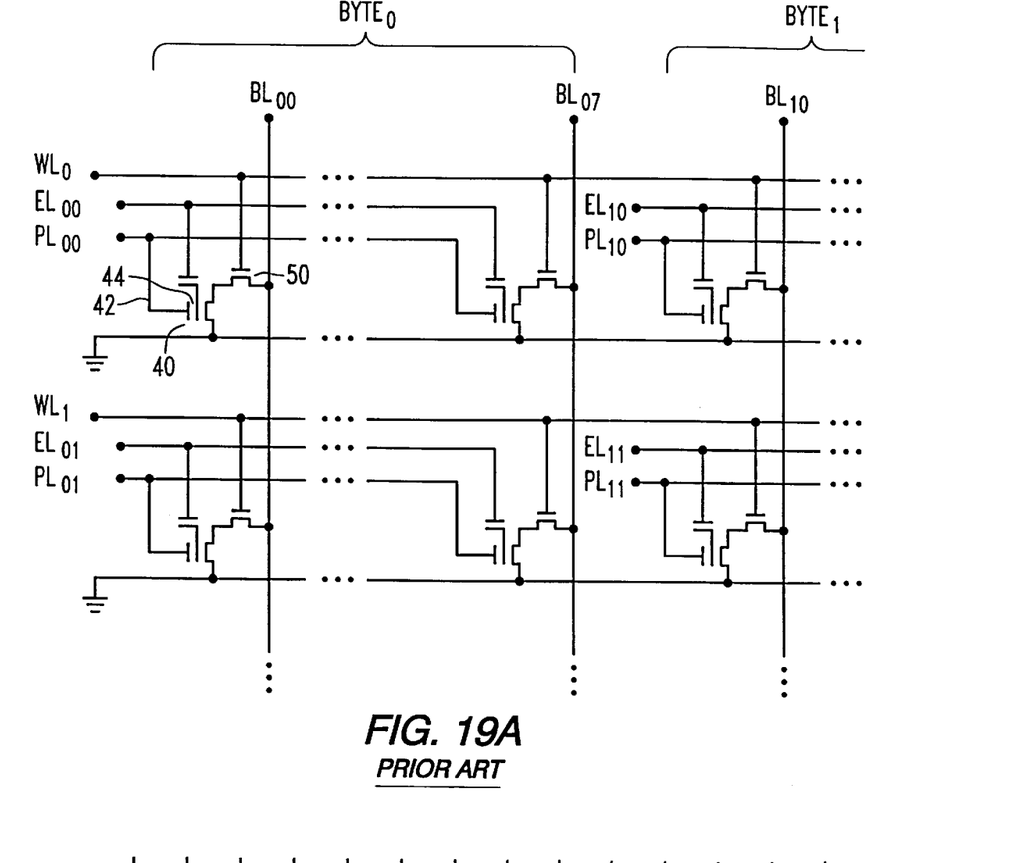
FIG. 19a is a partial schematic of a prior art EEPROM cell.
Figure 19B:
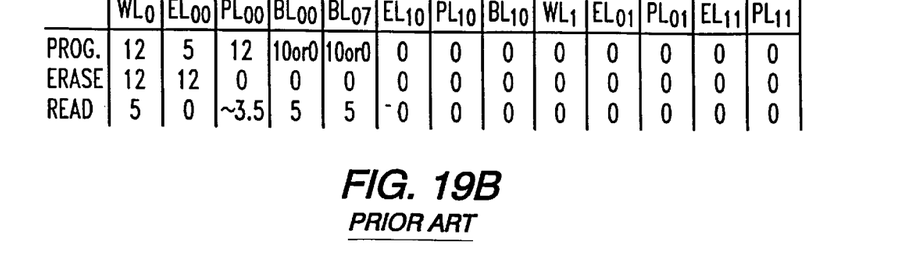

An unprogrammed storage transistor 160 has a threshold voltage of about −1 volt. When accessed, it outputs a voltage of approximately 4.3 volts. Once programmed, the trapped positive charge increases the threshold magnitude from −1 volts to about −6 volts. So, when the device 160 is accessed it would be normally off and the output would always be 0 volts as shown in FIG. 18. So, with FIG. 18, the electrons in the N well 103.2 are attracted into the BPSG layer 104 by the high positive voltage applied to the gate 112.2. As the electrons enter BPSG layer 104, the POHC traps containing the trapped holes receive the electrons and thus the BPSG layer 104 becomes neutralized. The BPSG layer 104 does not trap any more electrons than is necessary to neutralize the previously trapped holes. This is confirmed by FIG. 1 which shows that film A, an APCVD BPSG film such as film 104 saturates with electrons and does not trap electrons.

Having thus described the preferred embodiment of the invention, those skilled in the art will appreciate that further changes, additions, modifications and alterations to the preferred embodiment may be made without departing from the spirit and scope of the invention as set forth in the following claims.

VI. References

1. D. L. Griscom, E. J. Friebele, K. J. Long, and J. W. Fleming, *J. Appl. Phys.*, 43 (3), pp 960–967, March, 1976.

2. D. L. Griscom, G. H. Sigel, Jr., and R. J. Ginther, *J. Appl. Phys.*, 54 (7), pp 3743–3762, July 1983.

3. W. L. Warren, M. R. Shancyfelt, D. M. Fleetwood, and P. S. Winokir,*Appl. Phys. Lett.*, 67 (7), pp 995–997, Aug. 14, 1995.

4. W. L. Warren, M. R. Shaneyfelt, D.m M. Fleetwood, P. S. Winokir, *IEEE Trans. Nucl. Sci.*, 42 (6), pp 1731–1739, December, 1995.

5. J. F. Conley, Jr., P. M. Lenahan and P. Roitman, *IEEE Trans. Nucl. Sci.* 38 (6), pp 1247–1252, December, 1991.

What is claimed is:

1. A process for controlling the radiation hardness of a layer of BPSG comprising the steps of:

in a reaction chamber, introducing precursors of boron and phosphorous over a semiconductor wafer;

introducing silane and nitrous oxide;

reducing the pressure of the reaction chamber to less than atmospheric pressure;

generating a plasma in the vicinity of the substrate surface to deposit a layer of BPSG on said substrate; and controlling the radiation hardness of the BPSG layer by increasing the number of hole trapping centers in the BPSG layer by reducing the ratio of phosphorous precursor to nitrous oxide.

2. A process for controlling the radiation hardness of a layer of BPSG comprising the steps of:

in a reaction chamber, introducing precursors of boron and phosphorous over a semiconductor wafer;

introducing silane and nitrous oxide;

reducing the pressure of the reaction chamber to less than atmospheric pressure;

generating a plasma in the vicinity of the substrate surface to deposit a layer of BPSG on said substrate; and controlling the radiation hardness of the BPSG layer by reducing the number of hole trapping centers in the BPSG layer by increasing the ratio of phosphorous precursor to nitrous oxide.

3. A process for controlling the radiation hardness of a layer of BPSG comprising the steps of:

in a reaction chamber, introducing precursors of boron and phosphorous over a semiconductor wafer;

introducing silane and nitrous oxide;

reducing the pressure of the reaction chamber to less than atmospheric pressure;

generating a plasma in the vicinity of the substrate surface to deposit a layer of BPSG on said substrate; and controlling the radiation hardness of the BPSG layer by increasing the number of hole trapping centers by reducing the pressure in the reaction chamber.

4. A process for controlling the radiation hardness of a layer of BPSG comprising the steps of:

in a reaction chamber, introducing precursors of boron and phosphorous over a semiconductor wafer;

introducing silane and nitrous oxide;

reducing the pressure of the reaction chamber to less than atmospheric pressure;

generating a plasma in the vicinity of the substrate surface to deposit a layer of BPSG on said substrate; and controlling the radiation hardness of the BPSG layer by decreasing the number of hole trapping centers by increasing the pressure in the reaction chamber.

5. A method for manufacturing an EEPROM with field effect and storage transistors wherein the storage transistors each have a BPSG gate insulating region, said method comprising the steps of:

in a reaction chamber, introducing precursors of boron and phosphorous over a gate region on the surface of a semiconductor wafer;

introducing silane and nitrous oxide;

reducing the pressure of the reaction chamber to less than atmospheric pressure;

chemical vapor depositing a layer of BPSG on said semiconductor wafer;

adjusting the number of hole trapping centers in the BPSG layer by adjusting the ratio of silane to nitrous oxide;

selectively removing portions of the BPSG layer to provide insulating regions between the gates of each storage transistor and the semiconductor wafer;

depositing a field effect transistor gate layer;

selectively removing portions of the field effect transistor gate layer to form field effect transistor gate insulating regions; and depositing a layer of conductive material on the field effect transistor insulating gate regions and on the storage transistor insulating gate regions.

6. The method of claim 5 wherein the field effect transistor has an insulating gate region of silicon dioxide.

7. The method of claim 5 wherein the gate conductive material comprises doped polysilicon.

8. A method for manufacturing an EEPROM with field effect and storage transistors wherein the storage transistors each have a BPSG gate insulating region, said method comprising the steps of:

in a reaction chamber, introducing precursors of boron and phosphorous over a gate region on the surface of a semiconductor wafer;

introducing silane and nitrous oxide;

reducing the pressure of the reaction chamber to less than atmospheric pressure;

chemical vapor depositing a layer of BPSG on said semiconductor wafer;

adjusting the number of hole trapping centers in the BPSG layer by adjusting the ratio of silane to nitrous oxide;

selectively removing portions of the BPSG layer to provide insulating regions between the gates of each storage transistor and the semiconductor wafer; and masking the BPSG layer and selectively removing portions of the BPSG layer to expose regions for forming field effect transistor insulating gate regions.

9. The method of claim 8 wherein a gate oxide is formed in the exposed regions.

10. The method of claim 9 wherein a layer of doped polysilicon is deposited over the substrate and is selectively removed to for conductive gates on the storage transistor insulating gate regions and on the field effect transistor insulating gate regions.

11. The method of claim 10 further comprising the steps of implanting regions adjoining the gates to form the source and drain regions for the transistors.

12. The method of claim 5, wherein said layer of BPSG is deposited directly on to said semiconductor wafer.

* * * * *